United States Patent [19]
Deleonibus

[11] Patent Number: 5,913,136
[45] Date of Patent: Jun. 15, 1999

[54] PROCESS FOR MAKING A TRANSISTOR WITH SELF-ALIGNED SOURCE AND DRAIN CONTACTS

[75] Inventor: Simon Deleonibus, Claix, France

[73] Assignee: Commissariat A L'Energie Atomique, Paris, France

[21] Appl. No.: 08/911,146

[22] Filed: Aug. 14, 1997

[30] Foreign Application Priority Data

Aug. 21, 1996 [FR] France ................................. 96 10333

[51] Int. Cl.⁶ ................................................ H01L 21/28
[52] U.S. Cl. ...................... 438/586; 438/453; 438/233; 438/449; 438/297; 438/225
[58] Field of Search .................................. 438/586, 453, 438/233, 449, 297, 225

[56] References Cited

U.S. PATENT DOCUMENTS

| | | | |
|---|---|---|---|
| 4,461,072 | 7/1984 | Wada et al. | 29/571 |
| 4,708,768 | 11/1987 | Enomoto et al. | 437/228 |
| 5,376,578 | 12/1994 | Hsu et al. | 437/56 |
| 5,550,071 | 8/1996 | Ryou | 437/41 |
| 5,612,247 | 3/1997 | Itabashi | 437/69 |
| 5,773,346 | 6/1998 | Manning | 438/297 |

FOREIGN PATENT DOCUMENTS

| | | |
|---|---|---|
| 61-058737 | 3/1986 | Japan . |
| 05149993 | 6/1993 | Japan . |

*Primary Examiner*—Olik Chaudhuri
*Assistant Examiner*—Daniel H. Mao
*Attorney, Agent, or Firm*—Burns, Doane, Swecker & Mathis, LLP

[57] ABSTRACT

The invention relates to a process for making a transistor with self-aligned contact points and comprises the following steps: formation of multiple layers on a substrate (100) and etching of the multiple layers using a first mask, but preserving a column of the multiple layer; formation of lateral spacers on the sides of the column and implantation of impurities; local oxidation of the silicon substrate within the implanted region and elimination of the lateral spacers; deposit of a layer of insulating material (130) surrounding the column; etching of the column in accordance with a second mask to form a grid structure (140) with second sides, and exposing third sides delimiting the active region; formation of self-aligned insulating spacers (142, 143) on the second and third sides, and implantation of the source and drain (150, 152); formation of contact points (160, 162).

10 Claims, 4 Drawing Sheets

PROCESS FOR MAKING A TRANSISTOR WITH SELF-ALIGNED SOURCE AND DRAIN CONTACTS

DESCRIPTION

1. Technical Field

This invention relates to a process for making a transistor with self-aligned contact points on a silicon substrate.

The process for the invention particularly relates to the manufacture of field effect type transistors of the isolated grid type, for example such as MOS (Metal-Oxide-Semiconductor) transistors.

Applications of the invention are in the microelectronics field, and particularly for the manufacture of integrated circuits with a high integration density.

2. State of Prior Art

FIG. 1 in the appended drawings schematically shows a section through the structure of a known type of field effect transistor.

In a silicon substrate 10, an active region 12 is laterally delimited by one or several field isolation pads, identified with reference 14. The field isolation pads 14 made of silicon oxide are manufactured by applying selective oxidation to the substrate 10 in the areas surrounding the active region(s). The active regions are usually protected by a mask of silicon nitride during this oxidation.

A transistor grid 16, formed above the active region 12, is separated from substrate 10 by a grid oxide layer 18. The sides of the grid 16 are isolated by lateral spacers 20.

A double implantation of doping impurities in the active region 12 of the substrate 10 forms drain 24 source regions 22. A first implantation with weak dosing is done simply by using the grid 16 as implantation mask. A second implantation with higher dosing is then done after the formation of the lateral spacers. During the second implantation, the assembly formed by the grid and the lateral spacers is used as a etching mask. This double implantation can produce source and drain regions with a gradual concentration.

After formation of the grid 16 and source and drain regions 22, 24, the entire structure is covered with a thick layer 26 of insulating material based on silicon dioxide.

Openings 30, 32 are formed in the layer of insulating material 26, approximately in line with the source and drain regions 22, 24. Finally, the openings are filled in with an electrical conducting material 34 in electrical contact with the source and drain regions. The conducting material then forms the contact points.

Interconnection lines shown as reference 38 formed on the layer 26 of insulating material are connected to the electrical conducting material 34. They interconnect the various components formed on the same substrate.

This type of structure and its manufacturing process as briefly described above, have a number of limitations when attempting to miniaturize components and integrated circuits.

Openings 30, 32 and the contact points formed in them are large, and this is one of the major obstacles to miniaturization.

The global size of contact points includes not only the size of the openings 30 and 32 themselves, but also includes the dimensions necessary for the minimum distance that has to be maintained firstly between the contact points and the grid 16, and secondly between the contact points and the field insulation 14.

These minimum distances are related particularly to the resolution of the photo-lithoengraving tools used to define etching masks when making openings 30 and 32. In practice, in order to compensate the limitations due to the resolution of tools, diffused areas on which contact points are made are enlarged. This appears for example on a Figure in document (1), the reference of which is given at the end of this description.

Miniaturization of transistors and circuits formed with these transistors requires the use of high precision tools and therefore manufacturing costs are high.

FIG. 2 in the drawings shows the consequences of an error in the alignment of contact points on a drain region or a source region of a transistor. In the example shown in FIG. 2, a contact opening is offset towards a lateral insulation layer.

In order to simplify the description in FIG. 2, parts identical or similar to parts in FIG. 1 have the same numeric references and consequently, the description above is applicable to them.

FIG. 2 only shows a single contact made on a source region 22, however the following reasoning is equally applicable to a drain contact point.

As shown in FIG. 2, the upper edge of the field oxide 14 facing the source 22 was attacked when etching the contact opening 32 in the insulating layer 26. The layer 26 and the field oxide 14 are both based on silicon oxide and the etching defining the openings of the contact points does not give good selectivity of one of these parts with respect to the other.

Thus at the bottom of the contact openings, there is a risk of a direct contact between conducting material formed in these openings to make the contact points, and the substrate 10. This creases a risk of a systematic short circuit with the substrate in the source and drain regions.

Furthermore, even in the case in which the field oxide is only partially attacked as shown in the drawing in FIG. 2, the quality of the insulation that it provides is reduced.

In order to limit the negative effects of the misalignment in the contact openings and overlapping of the contact openings on field oxide regions, it is possible to dope parts of the substrate located under the contact openings. This type of doping is shown as reference 40 in FIG. 2. Its effect is to prolong the source region 22 under the contact opening 32. Thus, when this opening is filled with a conducting material, this material is not directly in contact with the substrate 10.

These measures are complex, and only provide a partial solution to the problem that arises.

Consequently, the purpose of this invention is to provide a process for manufacturing a transistor in which the above mentioned problems do not occur.

One of the main purposes of the invention is to provide a process for manufacturing a transistor in which physical separation is automatically provided between the contact points and the edge of field oxides, regardless of the thickness of these oxide fields.

Another purpose is to provide a process for making more highly miniaturized transistors and consequently circuits with a higher integration density.

Another purpose is to provide a process that largely overcomes the constraints related to the resolution of photo-lithoengraving tools used.

DESCRIPTION OF THE INVENTION

In order to achieve the purposes mentioned above, the object of the invention is more precisely a process for making a transistor with self-aligned contact points on a substrate, comprising the following successive steps:

a) formation on a substrate of multiple layers, comprising a grid oxide layer, a grid layer, and a protection layer, in this order, b) formation of the first etching mask on the multiple layer, the mask having at least one pattern corresponding to an active region of a transistor, and etching of this multiple layer in accordance with the first mask, stopping on the grid oxide layer, and maintaining at least one column of the multiple layer corresponding to the pattern of the said active area, c) formation of lateral spacers on the sides of the column and implantation of doping impurities capable of facilitating oxidation in a region of the silicon substrate not masked by the column and the lateral spacers, d) local oxidation of the silicon substrate in the implanted region and elimination of lateral spacers and the protection layer, to form a field insulation layer (oxide), e) deposit of a layer of insulating material surrounding the column and polishing the layer of insulating material, stopping on the multiple layer column, f) formation of a second mask with a grid pattern and etching of the column according to the second mask, stopping on the grid oxide layer to form a grid structure with second sides, and to expose the third sides delimiting the active region, g) formation of self-aligned insulating lateral spacers on the second and third sides, implantation of the source and drain in the silicon substrate on each side of the grid structure and in regions in which the grid oxide is exposed by etching of the column, and h) elimination of the exposed grid oxide and formation of contact points on source and drain, self-aligned on the grid structure.

Due to localized oxidation of the substrate in the implanted region, and the lateral spacers formed on the sides of the column, the oxidized region that forms the field insulation on each side of the active region is separated from the drain and source regions.

Furthermore, since the contact points are self-aligned on the grid structure and the third sides that delimit the active region, a clearance distance is formed between these contact points and the field insulation. Consequently contact points are also self-aligned with respect to the field insulation. A clearance distance is also maintained between contact points and the grid.

Clearance distances may easily be adjusted by varying the thickness of the lateral spacers, and possibly by the implantation of doping impurities (n or p) during step c). Furthermore, adjustment of clearance distances does not depend on dispersions of dimensions or any defects in the alignment of the photolithography equipment.

According to another improvement to the invention, the process may also include formation of a "shunt" layer after step e) in contact with the column grid layer and covering the layer of insulating material. The second mask is formed above the shunt layer and the shunt layer is also etched during step f) to form part of the grid structure.

The shunt layer, when it is being shaped, may form a transistor grid addressing line, for example such as a line of words in a read only memory (an illustration is given in document (1)).

According to another aspect of the invention, a first protective layer of silicon oxide and a second protective layer of silicon nitride covering the silicon oxide layer may be formed on the multiple layer during step a), the second protective layer of silicon nitride being eliminated during step d), and the first protective layer being eliminated during step e).

An electrical insulating layer may beneficially be formed above the shunt layer, the electrical insulating layer being etched with the shunt layer during step f). Note that the spacers formed during step g), also cover the sides of the shunt layer. Thus, the shunt layer is insulated on the top by the insulating layer, and on its sides by the insulating lateral spacers formed during step g).

With these measures, the contact points may be easily formed by a deposit conform with a metal layer coming into contact with the source and the drain, this metal layer being polished and stopping on the electrical insulating layer covering the shunt layer, and shaping of the metal layer.

According to another aspect of the invention, it is possible to form an oxide layer on the sides of the column before lateral spacers are formed on these sides in step c), the side of the side oxide layer facing the column being exposed during step f) to form third sides delimiting the active region.

This characteristic is particularly beneficial when silicon or polysilicon is used as the grid material. In this case, the sides oxide layer can relieve stresses that may occur between the lateral spacers, for example made of silicon nitride, and the grid. These stresses may appear particularly during heat treatment of the structure during the process, such as a creep in the insulating material deposited during step e), or annealing to activate the source and drain ionic implantation. The role of the silicon oxide layer is thus similar to the role of a mechanical buffer.

For example when using the process according to the invention, it is possible to use a solid silicon substrate or a silicon type substrate on an SOI (Silicon On Insulator) insulator, forming a multiple layer with a surface silicon layer on a silicon oxide layer called a buried layer.

In the case of an SOI type substrate, the multiple layer formed in step a) in the process is formed on the silicon surface layer.

Other characteristics and advantages of the invention will become evident by reading the following description which refers to the drawings in the appendix which are given solely for illustrative purposes, and are in no way restrictive.

DETAILED DESCRIPTION OF EMBODIMENTS OF THE INVENTION

Figure 1:
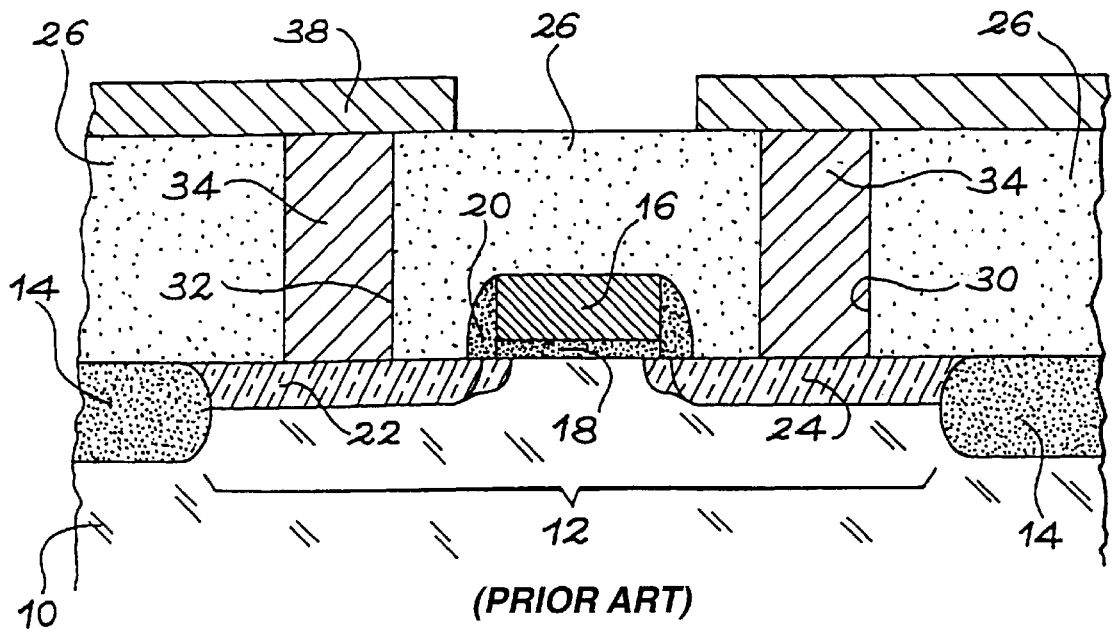
FIG. 1, already described, is a schematic section through a known type of transistor, FIG. 2, already described, is a schematic section of a detail of a known type of transistor illustrating the result of an error in the alignment of a contact opening on a source (or drain) region on this transistor.
Figure 2:
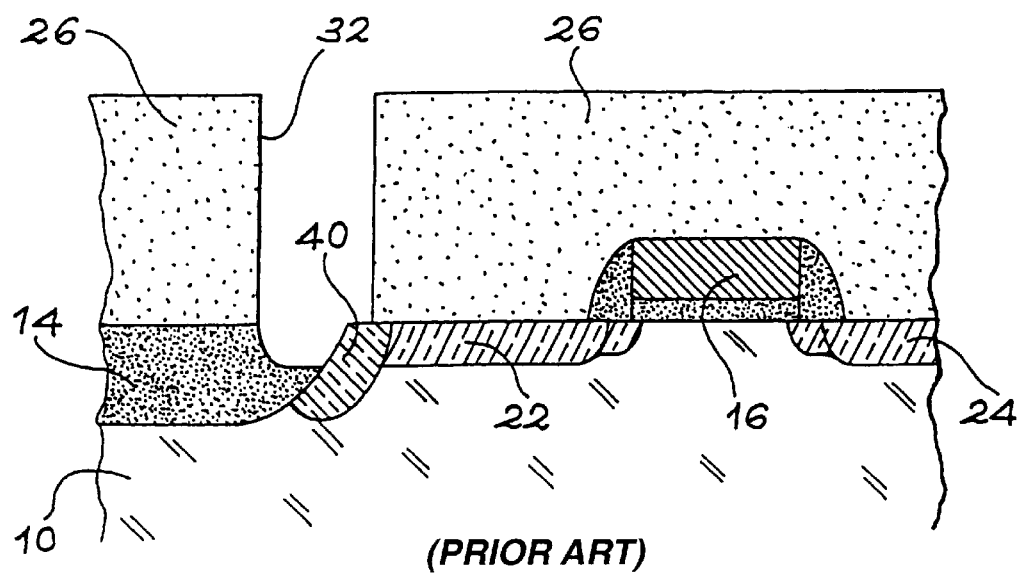
Figure 3:
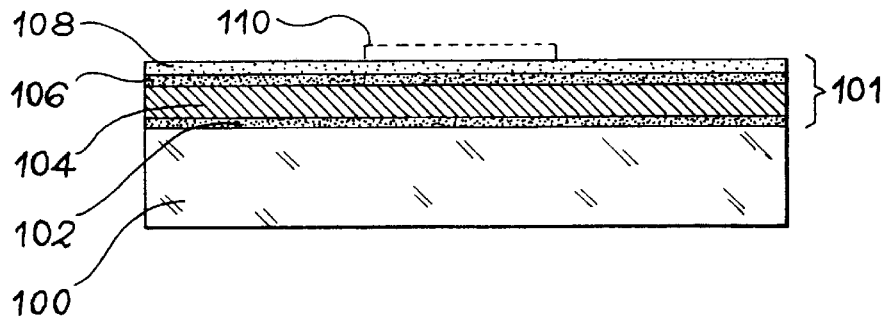
FIG. 3 is a schematic section through a structure obtained after the first step in the process according to the invention corresponding to the formation of multiple layers.

FIG. 3 shows a first step in the process.

As shown in the Figure, a multiple layer 101 is formed on the silicon substrate 100, comprising a grid oxide layer 102, a polycrystalline silicon (polysilicon) grid layer 104 forming the grid material, a thin layer of silicon oxide 106 forming a first protection layer and a silicon nitride layer 108 forming a second protection layer for the grid layer 104.

The grid oxide layer 102 may be formed directly by thermal oxidation of the silicon substrate 100.

Layers 104, 106 and 108 are then deposited successively.

The $SiO_2$ layer 106 is very thin, for example between 10 nm and 50 nm, and in particular limits the stress on the active area during oxidation of the sides, and acts as a stop layer during elimination of the second protection level 108.

Reference 110 in FIG. 3 shows a first etching mask identified by discontinuous lines. For example, this may be a photosensitive resin mask formed using known photolithography techniques.

This mask forms a pattern that defines the location and size of the active region (drain, channel, source) of the transistor that is to be made.

Only one etching mask is shown in the illustrated embodiment. This applies to the manufacture of a single transistor. Note however that it is quite possible to make a large number of transistors simultaneously on the same substrate and within the same multiple layer.

In particular, this is the case when it is required to make an integrated circuit containing a large number of transistors. In this case, a mask with a large number of patterns is formed on the multiple layer 101.

Figure 4:
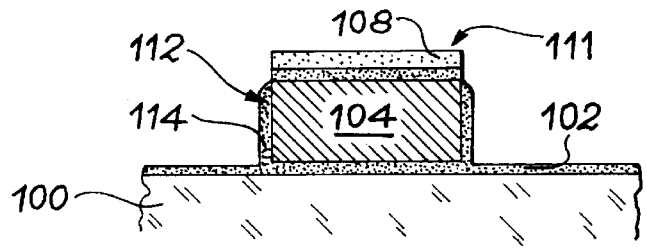
FIG. 4 is a schematic section of a structure obtained at the end of the second step in the process according to the invention corresponding to a first etching of the multiple layers.

After placing the mask, the multiple layer 101 is etched according to the pattern of the mask, stopping on the grid oxide layer 102. During this etching, a column 111 is retained in the multiple layer 101, as shown in FIG. 4. The sides 112 of the column are oxidized so that they can be covered with a side oxide layer 114.

Figure 5:
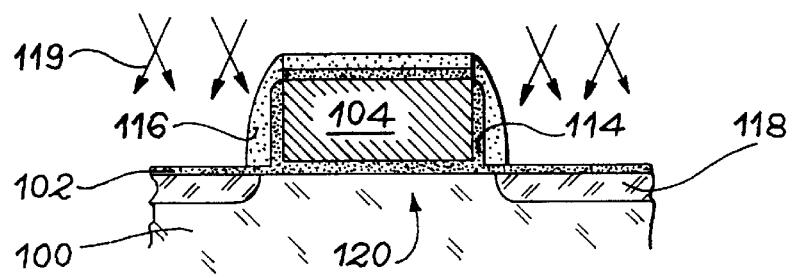
FIG. 5 is a schematic section through a structure obtained during a third step in the process according to the invention.

The advantage of the side oxide layer becomes obvious in FIG. 5.

FIG. 5 shows the formation of lateral spacers 116 on the sides of column 111, and then the implantation of doping impurities around column 111 to form implanted regions 118.

The lateral spacers 116 are formed by a solid plate deposit of a silicon nitride layer, and then by anisotropic etching of this layer to eliminate it entirely, except for the part covering the sides of column 111. During this step, the layer 108 is slightly attacked over a thickness equivalent to the thickness dispersion after deposit.

The side oxide layer 114 formed during the previous step forms a buffer layer between the grid material, in this case polysilicon, and the silicon nitride in the lateral spacers. The oxide on the sides relieves stresses between these two materials and in particular stresses caused by heat treatments carried out later during the process.

The implantation of $n^+$ type doping impurities such as phosphorus or arsenic, or $p^+$ type impurities such as boron or indium, can form one or several doped silicon regions 118 around the column, and which have the property of oxidizing faster than undoped silicon. For example, for $n^+$ doping with phosphorus atoms at a dose of $10^{20}$ $cm^{-3}$, the ratio of the oxidization rate of the doped silicon to the oxidization rate of undoped silicon is 3. For $p^+$ doping with the same concentration, the ratio between the oxidation rates on the doped silicon and on the undoped silicon is 2.

The implantation operation is shown schematically in FIG. 5 by arrows 119. During this implantation, the protection layers 106 and the attacked layer 108 protect the grid material. The overall column 111 forms a mask that prevents implanted impurities from reaching a portion of the silicon layer 100 under the column. This portion of the silicon layer corresponding to the active part of the transistor is identified as reference 120.

Following implantation, the doped part of the silicon in the substrate is oxidized locally.

Figure 6:
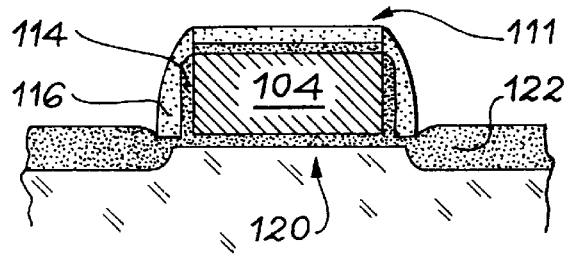
FIGS. 6 and 7 are schematic sections of a structure illustrating a fourth step in the process according to the invention.

This oxidation, which may be done under steam at a temperature of the order of 950° C., can form a field oxide layer 122 surrounding column 111. This layer can be seen in FIG. 6.

Note that the field oxide layer 122 does not reach the material in the grid layer 104, nor the oxide 114, but is separated from them particularly by lateral spacers 116.

Note also that the difference in the oxidation rate of doped parts and the oxidation rate of undoped parts prevent a bird's beak type deformation at the boundary of layer 112.

Figure 7:
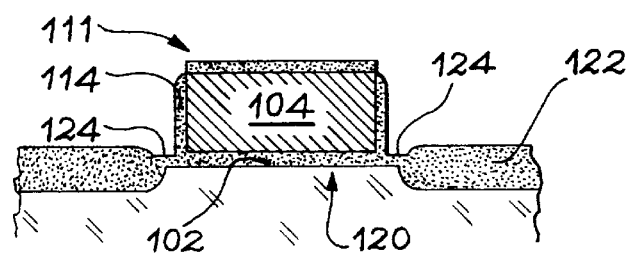

After elimination of the silicon nitride lateral spacers 116, and the second protection layer 118 also made of silicon nitride, the structure shown in FIG. 7 is obtained.

Note a space 124 in FIG. 7 separating the field oxide layer 122 from the side(s) 114 of column 111. The size of the space 124 is not dictated by the dimensions of the transistor manufacturing patterns (masks), but depends mainly on the size of the previously formed lateral spacers (see FIG. 6), the ion implantation (see FIG. 5) and the oxidization time necessary to obtain the oxide layer 122.

Figure 8:
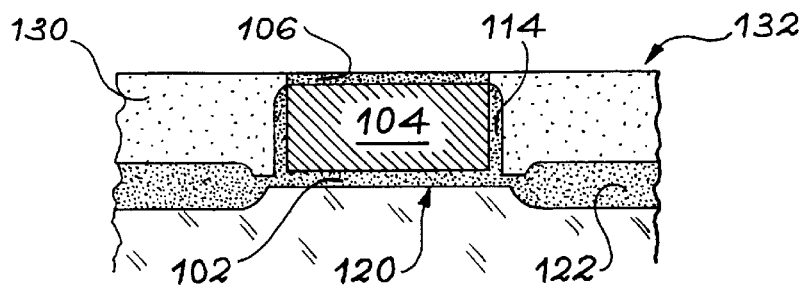
FIG. 8 is a schematic section through a structure obtained after a fifth step in the process according to the invention corresponding to the deposit of an insulating material surrounding the active region of the transistor being manufactured.

FIG. 8 shows the formation of a layer 130 of insulating material around column 111. Layer 130 has a plane upper surface 132, which is flush with the top of column 111. The sides of column 111 and the field oxide layer 122 are also covered by layer 130.

Layer 130 may be formed for example by a solid plate deposit of a doped oxide layer such as PSG (Phosphosilicate Glass) or BPSG (Borophosphosilicate Glass), and by flattening this layer and stopping it on the multiple layer in column 111.

Layer 130 performs a number of functions. Firstly it electrically insulates the transistor that is made. It also forms a plane upper surface 132 and separates a "shunt" layer formed during a later step from the active region of the transistor.

Figure 9:
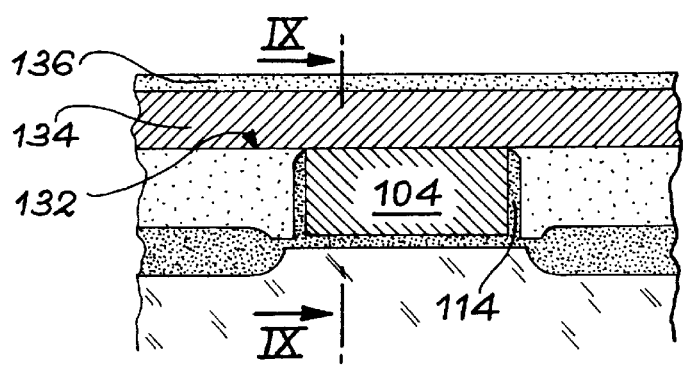
FIG. 9 is a schematic section through the structure shown in FIG. 6 on which a "shunt" material has been formed.

The formation of the shunt layer 134 is shown in FIG. 9. For example, this may be a layer of polycrystalline silicon and/or a layer of metal silicide such as tungsten silicide, formed on the plane upper surface 132. The shunt layer comes into contact with the layer of the grid material 104 that has been exposed by eliminating the first protection layer 106.

The shunt layer 134 may beneficially be covered with an insulating oxide layer 136. This layer electrically insulates the top of the shunt layer 134 from contact points on the transistor source and drain, made subsequently and described below.

As already mentioned, the shunt layer may form a grid addressing line, such as a line of words, after being shaped.

Figure 10:
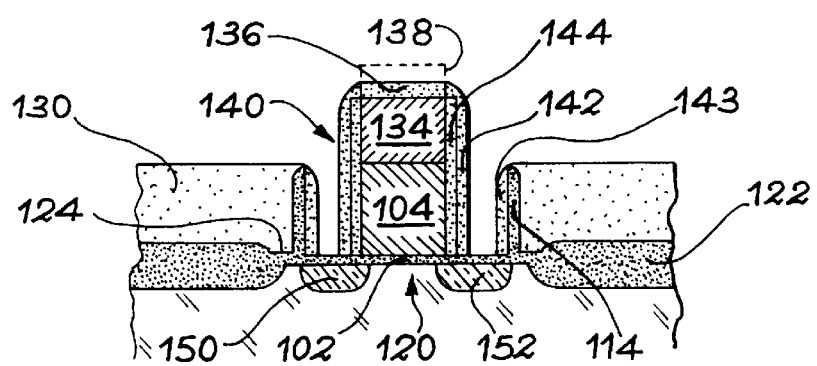
FIG. 10 is a schematic section of the structure shown in FIG. 9 along a section plane perpendicular to the section plane in the previous Figures and illustrating the etching of a grid structure.

The shunt layer may be shaped at the same time as a grid structure is formed. The grid structure is shown as reference 140 in FIG. 10. Note that in FIG. 10, and also in the next FIG. 11, sections are shown along a plane perpendicular to the plane of the sections in FIGS. 3 to 9. This section plane IX—IX is marked in FIG. 9.

The grid structure is etched using a second etching mask 138 stopping on the grid oxide layer 102. The mask 138 formed on layer 136 is shown as a dashed line in FIG. 10. For example, this may be a mask of photosensitive resin. This mask formed above column 111 defines the location and dimension of the grid structure.

The grid structure may for example be etched using an R.I.E. (Reactive Ion Etching). It is stopped firstly by the grid oxide layer 102, the side oxide layer 114 covering the side(s) of the column (FIGS. 4 to 9), and by the insulating layer 130 which is also an oxide layer. Thus the grid structure is self-aligned with respect to the sides of layer 130 and the side oxides 114, originating from the etched column and which then delimit the lateral sides of layer 130 facing the grid structure. In the remainder of this text, sides 114 are referred to as third sides. However, self-alignment of the grid structure is independent of the edge of the field oxide layer 122 that remains set back due to the spacing 124.

The sides of the grid structure, called the second and third sides, defined by the side oxide layer 114, are covered by silicon nitride spacers 142, 143. Like spacers 116, these spacers are formed by depositing a layer of silicon nitride and then by isotropic etching of this layer.

Beneficially, the second sides may be covered with a buffer oxide layer 144 before the formation of the spacers. The oxide layer 144 relieves stresses that may arise between materials forming the grid structure and the silicon nitride spacer 142 during subsequent heat treatment.

An ion implantation, for example arsenic ions for n channel transistors, through parts of the grid oxide layer exposed during etching of the grid structure, can form source regions 150 and 152 in the active region 120. The grid structure and the insulating layer 130 form implantation masks during this implantation.

The source and drain 150, 152 are aligned on the lateral spacers 142 and 143, and on the oxide layer 114 formed at the beginning of the process. They are not aligned on the edge of the field insulating layer 122 which is set back. This aspect can improve the electrical insulation between transistors.

Figure 11:
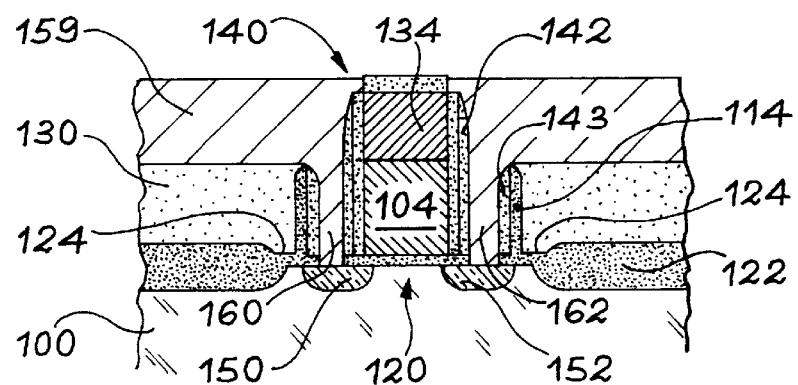
FIG. 11 is a schematic section through a transistor obtained at the end of the process according to the invention and illustrates the formation of contact points on the source and drain regions of this transistor, FIG. 12 corresponds to FIG. 3; it shows a schematic section through the structure obtained after the first step in the process according to the invention, in which a multiple layer was formed on an SOI type substrate, FIGS. 13 and 14 correspond to FIGS. 8 and 9 and are schematic sections illustrating steps in the process according to the invention.

A final step in the process, and the transistor finally obtained, are shown in FIG. 11.

The final step corresponds to the formation of contact points 160, 162 on the source and drain. It includes elimination of portions of grid oxide 102 exposed while etching the grid structure, a conform deposit of a metal layer 159, and flattening and shaping of this layer. Note that the risk of a short circuit between the metal layer 159 and the shunt layer 134 is prevented by insulating lateral spacers formed on the sides of the grid structure and by the insulating oxide layer 136 that covers the shunt layer.

The metal in layer 159, for example tungsten, may be deposited using a chemical vapor deposition (CVD) technique. The layer 159 may be flattened for example using a mechanical-chemical polishing type process stopping in layer 136, in order to isolate transistor source and drain zones from each other before continuing with shaping this layer. This shaping using conventional photolithography and etching techniques simultaneously provides interconnections between the various transistors or components of an integrated circuit on the same substrate.

FIG. 11 also shows that there is no risk of contact points 160, 162 overlapping onto the field insulation layer 122 with the process according to the invention. This is due particularly to the spacing 124, the magnitude of which may be controlled and is constant independently of etching patterns and the shapes or dimensions of the transistors made.

We will now describe a variant of the embodiment of the process on a silicon on insulator type substrate illustrated in FIGS. 12 to 15. The steps in the process remain practically the same, and the numeric references of elements shown in FIGS. 12 to 15 and which correspond to identical or similar elements in FIGS. 3 to 11, are the same. Consequently, the description above may be referred to for these elements.

Figure 12:
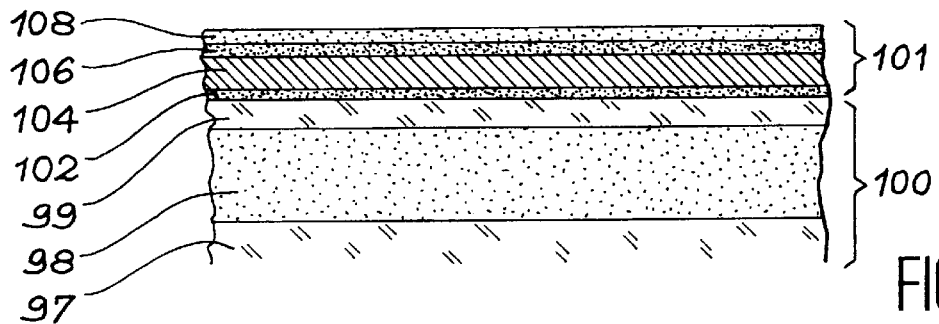

As shown in FIG. 12, the starting point is an SOI type substrate 100 comprising a thick silicon support layer 97, a "buried" silicon oxide layer 98, and a silicon "surface" layer 99. The buried layer 98 is electrically insulating and is placed between silicon layers 97 and 99.

A multiple layer 101 comprising a grid oxide layer 102, a grid material layer 104 and protection layers 106, 108 are formed on the SOI substrate 100. Refer to the explanations for FIG. 3 in this respect.

Figure 13:
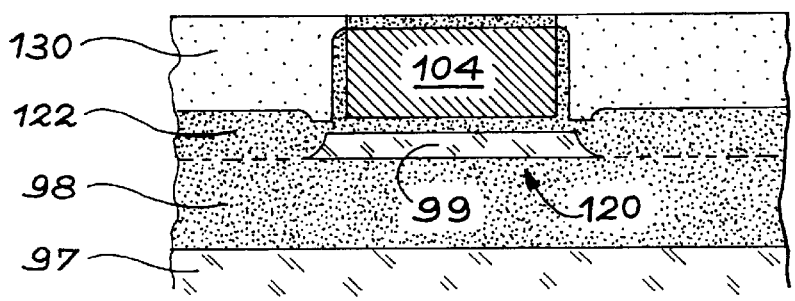

FIG. 13 corresponds to FIG. 8. It shows the structure obtained after oxidation to form the field oxide layer 122, and after formation of the insulating material layer 130.

Implantation and oxidation steps leading to the formation of the field oxide layer 122 are carried out at a sufficient depth and over a sufficient thickness so that layer 122 occupies the entire thickness of the SOI substrate surface layer 99. Consequently the field oxide layer 122 extends as far as the buried layer 98, which is also insulating. Only part of the surface layer 99 located under column 111 is kept, to form the active part 120 of the transistor.

Figure 14:
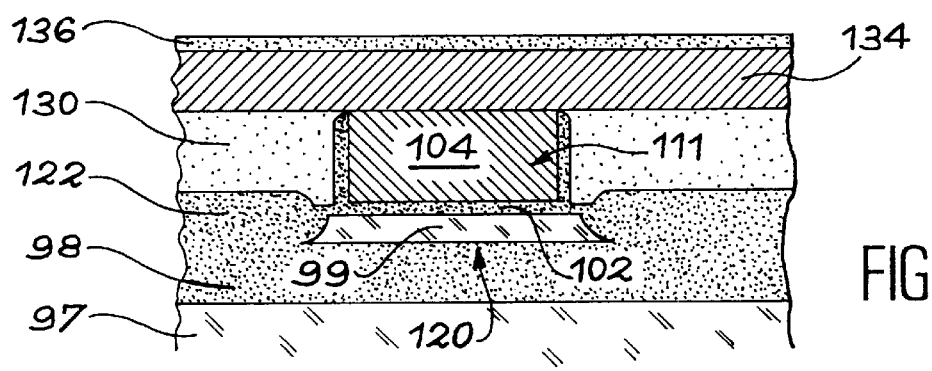

FIG. 14 corresponds to FIG. 9 and shows the formation of the shunt layer.

Etching of this layer, and etching of column 111 to form the grid, are done under the same conditions as described above. The grid oxide layer 102 forms an etching stop layer.

Figure 15:
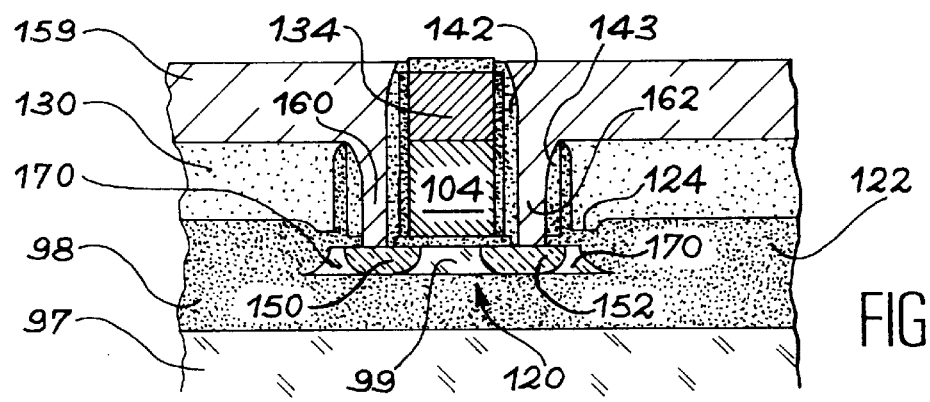
FIG. 15 is a schematic section along a section plane perpendicular to the section plane in FIGS. 12 and 14, showing a transistor obtained on an SOI type substrate in accordance with the process according to the invention.

FIG. 15 corresponds to the previous FIG. 11. It is a section along the same section plane as FIGS. 10 and 11.

It shows the implantation of source region 150 and drain region 152 in the portion of layer 99 that is preserved under column 111 (see FIG. 14) and corresponding to the active part 120.

The source and drain 150 and 152 are self-aligned on the side spacers 142 and 143 formed on the second and third sides.

Thus, due to these spacers and due to the spacing 124 already mentioned, the source and drain regions 150, 152 are not directly in contact with the field oxide layer 122. There are portions of the layer 99 marked with reference 170 remaining between the source and drain regions, and the field oxide layer. Portions 170 reduce the risks of a leakage current, and particular leakage through the bottom of layer 99 towards layer 98.

REFERENCE DOCUMENT

1) Status, Trends, Comparison and Evolution of EPROM and FLASH EPROM Technologies by A. Bergemont pages 575–582 Proc. 23rd ESSDERC, Grenoble September 1993, "Status, Trends, Comparison and Evolution of EPROM and FLASH EPROM Technologies".

I claim:

1. Process for making a transistor with self-aligned contact points on a substrate, comprising the following successive steps:

a) formation on the substrate of multiple layers, comprising in order a "grid oxide" layer, a grid layer, and at least one protection layer, b) formation of a first etching mask on the multiple layer, the mask having at least one pattern corresponding to an active region of a transistor, and etching of this multiple layer in accordance with the first mask, stopping on the grid oxide layer, and maintaining at least one column of the multiple layer corresponding to the said active area, c) formation of lateral spacers on the sides of the column and implantation of doping impurities capable of facilitating oxidation in a region of the silicon substrate not masked by the column and the lateral spacers, d) local oxidation of the silicon substrate in the implanted region and elimination of lateral spacers and the protection layer, to form a field oxide layer, e) deposit of a layer of insulating material surrounding the column and polishing the layer of insulating material, stopping on the multiple layer column, f) formation of a second mask with a grid pattern on the column and etching of the column in accordance with the second mask, stopping on the grid oxide layer to form a grid structure with second sides, and to expose the third sides delimiting the active region, g) formation of self-aligned insulating lateral spacers on the second and third sides, implantation of the source and drain in the silicon substrate on each side of the grid structure and in regions in which the grid oxide is exposed by etching of the column, and h) elimination of the exposed grid oxide and formation of contact points on source and drain, self-aligned on the grid structure.

2. Process according to claim 1, characterized in that before the formation of lateral spacers on the sides of the column during step c), a side oxide layer is formed on these sides, the edge of the side oxide layer facing the column being exposed during step f) to form third sides delimiting the active region.

3. Process according to claim 2, characterized in that since the grid layer is a layer of polycrystalline silicon, the side oxide layer is formed by surface oxidation of the sides of column.

4. Process according to claim 1, characterized in that impurities leading to an n type or p type doping are implanted in step c).

5. Process according to claim 1, characterized in that it also comprises the formation of a "shunt" layer in contact with the grid layer of column and covering the insulating material layer after step e), the second mask being formed above the shunt layer and the shunt layer also being etched during step f) to form part of the grid structure.

6. Process according to claim 5, characterized in that an electrical insulating layer is formed above the shunt layer, the second mask being formed above the insulating layer, the electrical insulating layer being etched with the shunt layer during step f).

7. Process according to claim 6, characterized in that the formation of contact points includes the conform deposit of a metal layer (159) coming into contact with the source and drain, polishing of the metal layer stopping on the electrical insulating layer covering the shunt layer, and shaping of the said metal layer.

8. Process according to claim 1, characterized in that a first protection layer of silicon oxide, and a second protection layer of silicon nitride covering the layer of silicon oxide are formed on the multiple layer during step a), the second silicon nitride protection layer being eliminated during step d) and the first protection layer being eliminated during step e).

9. Process according to claim 1, characterized in that a solid silicon substrate is used.

10. Process according to claim 1, characterized in that a silicon on insulator (SOI) type substrate is used.

* * * * *